United States Patent
Gong et al.

(10) Patent No.: US 6,266,002 B1
(45) Date of Patent: Jul. 24, 2001

(54) 2ND ORDER NOISE SHAPING DYNAMIC ELEMENT MATCHING FOR MULTIBIT DATA CONVERTERS

(75) Inventors: Xue-Mei Gong, Austin, TX (US); Eric Gaalaas, Arlington, MA (US); Mark Alexander, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/394,145

(22) Filed: Sep. 10, 1999

(51) Int. Cl.$^7$ .............................. H03M 1/66; H03M 3/00
(52) U.S. Cl. ............................................. 341/150; 341/143
(58) Field of Search .................................. 341/150, 144, 341/145, 143, 118, 120, 126

(56) References Cited

U.S. PATENT DOCUMENTS 5,684,482 * 11/1997 Galton ................................. 341/144
5,818,377 * 10/1998 Wieser ................................. 341/144
6,137,430 * 10/2000 Lyden et al. ......................... 341/145

OTHER PUBLICATIONS

Yasuda et al, "A Third Order Delta–Sigma Modulator Using Second–Order Noise Shaping Dynamic Element Matching," IEEE 1879–1886, Dec. 1998.*

Radke et al, "A Spurious–Free Delta–Sigma DAC Using Rotated Data Weighted Averaging," IEEE, 125–128, Dec. 1998.*

Spectral Shaping of Circuit Errors in Digital–to–Analog Converters, Ian Galton, IEEE, pp. 808–817, Oct. 1997.

* cited by examiner

Primary Examiner—Patrick Wamsley
(74) Attorney, Agent, or Firm—Gregory M. Howison; Steven Lin

(57) ABSTRACT

A multi-bit DAC (109) is provided as part of a digital-to-analog data converter (DAC). The multi-bit DAC is comprised of a plurality of single-bit DACs (503) which have the values thereof selected through a digital encoder (505). The digital encoder (505) performs dynamic element matching (DEM) on an input data value. The sequence of selection is performed such that the element mismatch noise response of the DAC (109) is shaped. The outputs are summed at a summing junction (507) and then filtered with a low pass filter (113). In the noise shaping response, a cyclical second order response is provided with a Data Weighted Averaging (DWA) technique wherein the outputs of the DACs are restricted to one of two states. To achieve this, select ones of the output values are changed in order to comply with this restriction, thus deviating from a uniform element selection algorithm. This provides a constrained second order response which accounts for mismatching of the DAC elements (503).

38 Claims, 13 Drawing Sheets

| INDEX | It$_2$(i) | CTRL$_{INT1}$ | c$_{ij}^1$ | CTRL$_{INT2}$ |
|---|---|---|---|---|
| 0 | 1 | 1 | 0 | 0 |
| 1 | −2 | 1 | 1 | 0 |
| 2 | 1 | 1 | 0 | 1 |
| 3 | 2 | 0 | 1 | 0 |
| 4 | +0 | 0 | 0 | 1 |
| 5 | −3 | 0 | 0 | 1 |
| 6 | 2 | 0 | 0 | 0 |
| 7 | 1 | 0 | 0 | 0 |

US 6,266,002 B1

2ND ORDER NOISE SHAPING DYNAMIC ELEMENT MATCHING FOR MULTIBIT DATA CONVERTERS

BACKGROUND OF THE INVENTION

Delta Sigma (Δ-Σ) Analog-to-Digital converters (ADCs) and digital-to-analog converters (DAC's), collectively referred to as Δ-Σ data converters, are widely used in high-precision, low bandwidth applications, such as digital audio processing. Through the use of oversampling, the data path width can be reduced from, for example sixteen bits to one bit. The resultant quantization noise due to quantizing from sixteen bits to one bit is shaped such that the noise is moved outside of the signal band. The use of the smaller data path facilitates the design of the analog circuit, since a data path of, for example, one bit is the easiest for analog design.

To improve the performance of a Δ-Σ data converter, noise shaping is utilized. By increasing the order of the noise shaping, this inband noise performance can be improved. The primary purpose for utilizing the one bit modulator is the inherent linearity associated therewith, since one bit only requires two levels, requiring a straight line therebetween. The reason for going to a multi-bit modulator is primarily due to the lower out of band noise, which requires less analog circuitry for the filtering thereof. Other advantages are that it a) the modulator is more stable requiring less order with a higher gain factor, b) its inband noise is smaller, and c) there is less output jitter sensitivity since the steps are smaller in the output. Linear performance can only be achieved if the steps between adjacent output levels of each DAC have very nearly the same magnitude. This, therefore, requires a matching precision that is on the order of the desired precision of the overall data converter, and this is often beyond the practical limits of present manufacturing technology.

In order to solve the problem with element matching, various techniques have been utilized such as dynamic element matching in multi-bit noise-shaping DACs. In these techniques, the mismatches are accepted as inevitable, with their negative effects being avoided through signal processing, i.e., an intelligent selection of the DACs that are utilized in the conversion.

SUMMARY OF THE INVENTION

The present invention disclosed and claimed herein comprises a method for converting data which includes the step of first receiving the data to be converted in an associated conversion operation. The data is comprised of a series of data values, each associated with one conversion operation. This data is processed through a multi-bit digital-to-analog conversion operation. In this conversion operation, a plurality of digital-to-analog conversion (DAC) elements are provided, each operable to provide one of a plurality of discrete values therefrom. The discrete values for each of the elements are selected, with these values available for output from each of the DAC elements in accordance with the value being converted in the associated conversion operation. These outputs for each of the DAC elements are then summed for the associated received data and the associated conversion operation. The operation of selecting the discrete values in accordance with the uniform selection algorithm is such that the noise response of the digital-to-analog conversion operation is shaped. The uniform selection algorithm determines the values for each of the DAC elements associated with the conversion operation, accounting for mismatching in the DAC elements. A constraint is placed upon this uniform selection algorithm during the operation thereof to change the values of at least two of the DAC elements from that determined by the uniform selection algorithm. The result of the conversion operation is then output for each of the output conversion cycles.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
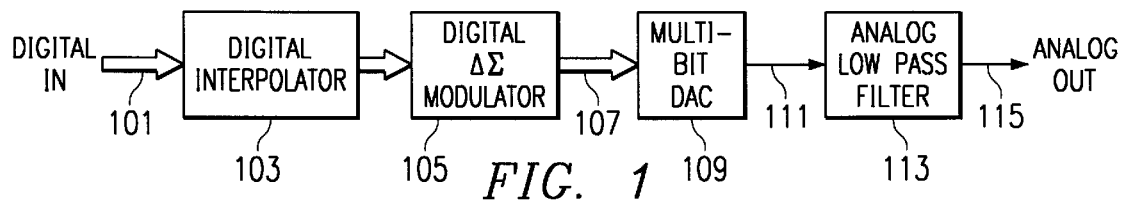
FIG. 1 illustrates a block diagram of a digital-to-analog converter utilizing a multi-bit DAC with noise shaping.

Referring now to FIG. 1, there is illustrated a block diagram of a Digital-to-Analog convertor utilizing the noise shaping techniques of the present disclosure. However, this is one example of a data converter, wherein an Analog-to-Digital converter would be another type. It should be understood that the description herein with respect to multi-bit DACs refers equally as well to analog-to-digital converters.

The digital signal is received on an input 101 and then is processed through a digital interpolator 103 to increase the sampling frequency thereof. Typically, this will be a multiplication factor of 128 $f_s$, or lower, $f_s$ being the sampling frequency of input the digital signal. The output of the digital interpolator, the oversampled value, is input to an oversampled digital $\Delta\Sigma$ modulator 105. This is a conventional structure and basically has associated therewith some type of quantization noise-shaping. This allows the $\Delta\Sigma$ modulator 105 to perform high-precision data conversion.

Oversampling necessitates the use of circuitry with a significantly higher bandwidth than the signal to be converted, and in high data rate applications this is often not practical. Generally, the oversampling requirement can be reduced by increasing the order of the quantization noise-shaping. This will allow the quantization noise to be moved out of the pass band or signal portion of the frequency band.

In the disclosed embodiment, the $\Delta\Sigma$ modulator 105 is a multi-bit modulator providing a multi-bit output on a multi-bit bus 107. This is input to a multi-bit digit-to-analog converter (DAC) 109 to generate an analog output on a line 111 before being input to an analog low-pass filter 113. This provides an analog output therefrom on a line 115.

If the $\Delta\Sigma$ modulator 105 were a 1-bit modulator such that a 1-bit stream were output therefrom, this would only require a 1-bit DAC, rather than the multi-bit DAC 109 of the disclosed embodiment. However, the quantization noise is higher for the 1-bit DAC than for a multi-bit DAC. Therefore, there is a desire to utilize the multi-bit $\Delta\Sigma$ modulator 105 and a multi-bit DAC. The reason for this is that, although the analog low pass filter 113 can reduce the quantization noise on the output thereof, this does require a considerably larger capacitor to obtain the desired out-of-band noise response. With the use of a multi-bit DAC 109, the noise can be reduced.

Figure 2:
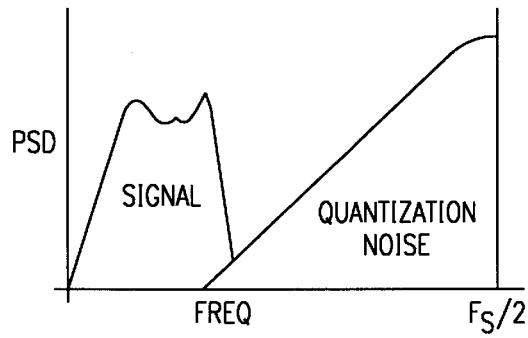
FIG. 2 illustrates a response for the output of the Δ-Σ signal modulator.

Referring now to FIG. 2, there is illustrated a frequency plot of the power spectral density (PSD) of the output of the $\Delta\Sigma$ modulator 105 on the bus 107. It can be seen that, in the pass band, the signal is processed with the quantization noise moved to the upper portion of the frequency. This is a conventional operation with the $\Delta\Sigma$ modulator 105 designed and optimized to move the noise out of the pass band and into the portion between the pass band and the frequency $F_s/2$. (This frequency $F_s$ is the modulator sampling rate which is different from input sampling rate $f_s$. Usually $F_s=128\ f_s$ for audio applications). In the absence of any errors introduced by the multi-bit DAC 109, the analog filter 113 would provide sufficient filtering to remove most of the quantization noise, and the result would be a high-precision analog representation of the original digital input sequence.

Figure 3:
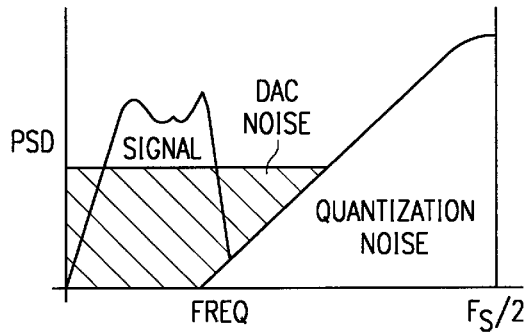
FIG. 3 illustrates a prior art response at the output of a multi-bit DAC.

Referring now to FIG. 3, there is illustrated a plot of the condition wherein considerable step-size mismatches exit within the multi-bit DAC 109 that result in DAC noise, of which a substantial amount resides within the signal band or the pass band. Thus, even though the analog filter 113 moves the components of the quantization and DAC noise outside of the signal band or pass band, much of the DAC noise remains and spoils the overall conversion precision.

Figure 4:
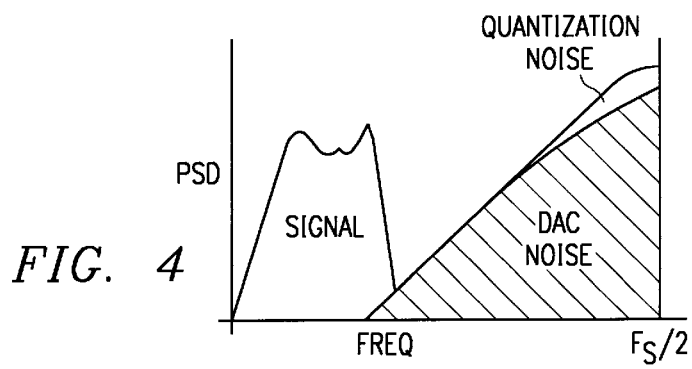
FIG. 4 illustrates a response of a noise-shape multi-it DAC.

Referring now to FIG. 4, there is illustrated a plot of the noise response wherein the multi-bit DAC 109 incorporates some type of noise-shaping. This results in DAC noise that resides primarily outside of the pass band, such that the analog filter 113 can remove this noise.

Figure 5:
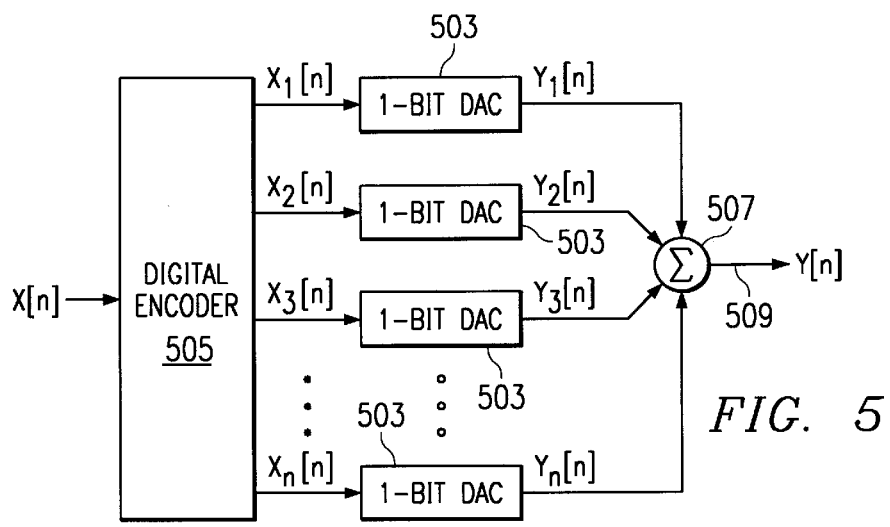
FIG. 5 illustrates a block diagram of the multi-bit DAC.

Referring now to FIG. 5, there is illustrated a block diagram of the architecture for realizing the multi-bit DAC 109 and for incorporating noise shaping. The DAC is comprised of a plurality of one-bit DAC elements 503 which are selected with a digital encoder 505. The digital encoder 505 is operable to receive the thermometer code modulator output x[n]. For example, if this were a 5-bit modulator, then there would be thirty-two 1-bit DACs 503. Each of these 1-bit DACs 503 would be selected based upon the thermometer coded modulator output value. If the modulator output were "5," then only five of the 1-bit DACs would be selected and the output thereof summed in a summation junction 507 to yield on an output 509 a summed value. However, it is the manner in which these DACs are selected that provides the noise shaping, as will be described in more detail hereinbelow. It should be noted that each DAC 503 has associated therewith an error due to mismatching of components. If the same sequence of DACs were always selected for the same input value, then there would always be that error associated with that number and this error would result in a nonlinearity.

Figure 6:
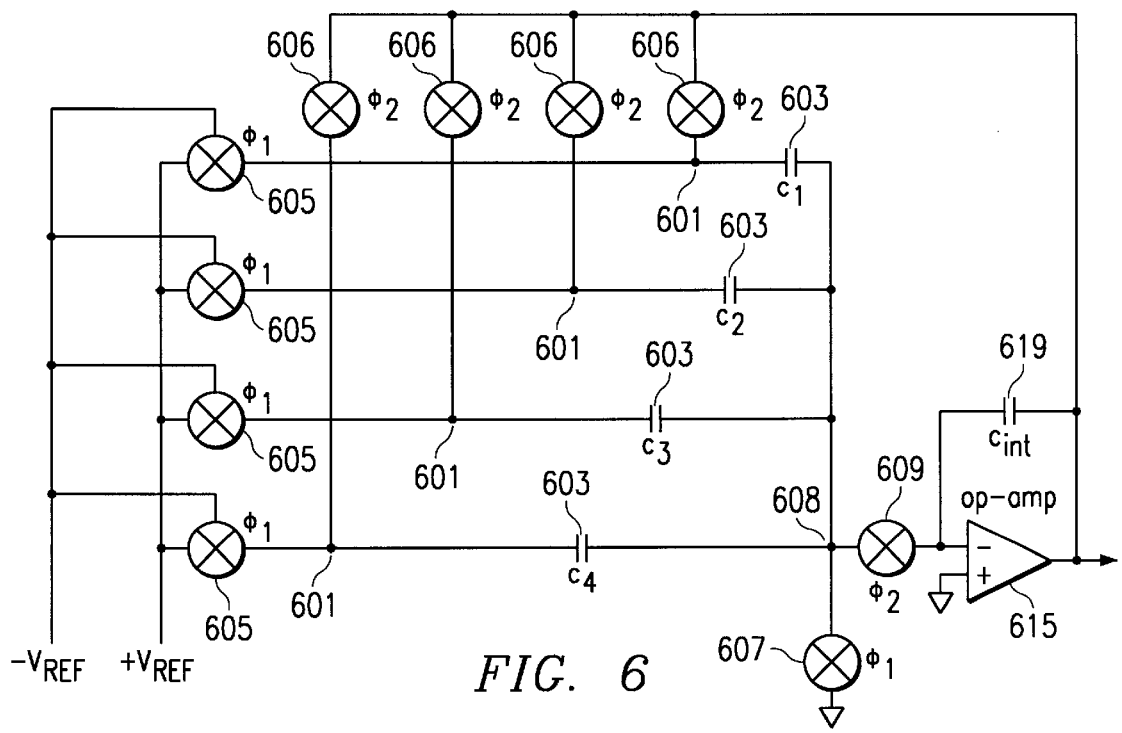
FIG. 6 illustrates a more detailed diagram of the multi-bit DAC of FIG. 5.

Referring now to FIG. 6, there is illustrated a more detailed diagrammatic view of the multi-bit DAC of FIG. 5 excluding the digital encoder 505. In FIG. 6, the 1-bit DAC elements 503 are each realized with a plurality switched capacitors 603, each capacitor 603 has one plate thereof connected to a node 601. Node 601 is connected to one side of an associated switch 605 and to one side of an associated switch 606. The other plate of each of the capacitors 603 is connected to a node 608. The node 608 is connected to ground through a switch 607 and to the negative input of an operational amplifier 615 through a switch 609. The output of the op-amp 615 comprises the output which is connected to the other side of the switches 606. A filter capacitor 619 is connected between the negative input and output of the op-amp 615. In operation, select one(s) of the capacitors 603 are connected to $+V_{REF}$, as determined by the encoder 505, and the rest of the capacitors 603 are connected to $-V_{ref}$ by switches 605, with switch 607 connected to ground. Then, switch 607 is opened and switch 609 closed, with the selected capacitors 603 having the associated switches 605 opened and the associated switches 606 closed.

As described hereinabove, selection of the 1-bit DAC elements 503 in FIG. 5 is done through a predetermined selection algorithm, which selection algorithm provides noise shaping. Although, a given value defines that a predetermined number of the 1-bit DACs 503 are to be selected, it is the order in which these are selected, which order is dependent upon the previous selection or conversion cycle. One technique for doing this in the prior art has been to utilize a random selection, such that the 1-bit DACs are randomly selected. This will, of course, remove any non-linearity from the system, but will result in a higher overall noise level. Other techniques utilize algorithms that, instead of trying simply to minimize mismatches to improve its designs, accept the mismatches and compensate for their negative effects through signal processing. One of these techniques is described in Ian Gaullon, "Spectral Shaping of Circuit Errors in Digital-To-Analog Converters," *IEEE Transactions on Circuit and Systems-2: Analog and Digital Signal Processing*, Vol. 44, No. 10, pp. 808–817, October 1997. This technique utilizes a selection algorithm requiring multiple layers of switching blocks to select the 1-bit DACs. This reference is incorporated herein by reference. Another reference, Henderson, R. K. and Nys, O.J.A.P., "Dynamic Element Matching Techniques with Arbitrary Noise Shaping Function," *IEEE International Symposium on Circuits and Systems*, pp. 293–296, May 1996, which is incorporated herein by reference, discloses a system that provides a cyclic selection of elements and provides noise shaping to both first and second order systems. This is what is referred to as a Data Weighted Average (DWA) technique. The Henderson system has some disadvantages in that the cyclic nature of the overall selection process still results in pattern dependency showing through in the noise. This is due to the fact that, for example, a series of 2s will show some type of pattern dependancy, even though there is some noise cancellation.

In the second order system, there will be a second order filter function for noise that will be as follows:

$$(1-z^{-1})^2 \qquad (1)$$

$$(1-2z^{-1}+z^{-2}) \qquad (2)$$

This is the frequency domain representation and, in the time domain the noise generated by the DAC would be represented for the kth conversion as:

$$n(k)=n_2(k)-2n_1(k)+n_0(k) \qquad (3)$$

with $n_1(k)=n_2(k-1)$ and $n_0(k)=n_1(k-1)$. This is referred to hereinbelow as "the noise equation."

Figure 7:
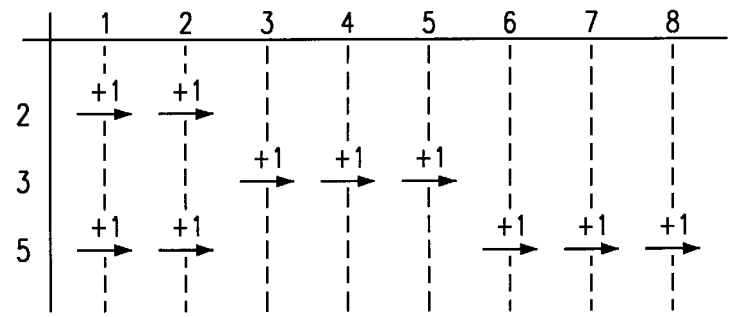
FIG. 7 illustrates a graphical view of a data conversion algorithm for converting between three sequential numbers and the selection of the DAC elements associated therewith.

In order to better describe the cyclic operation of the selection, reference is now made to FIG. 7. In FIG. 7, there is illustrated a diagrammatic plot of a sequence illustrating a first order system wherein a cyclical selection of elements is made. As noted, the sequence of the data is "2," "3," and "5." In the first operation, the first two DAC elements are selected with a value of "+1." When the value of "3" is converted, this requires that three DAC elements be selected. These are selected as the DAC elements 3–5, the next three DAC elements. When the value 5 is converted, this will require a selection of the DAC element 6, 7, 8, 1, and 2. This will continue in this cyclic manner for subsequent selections. This provides a first order DAC-element mismatch noise shaping.

Figure 8:
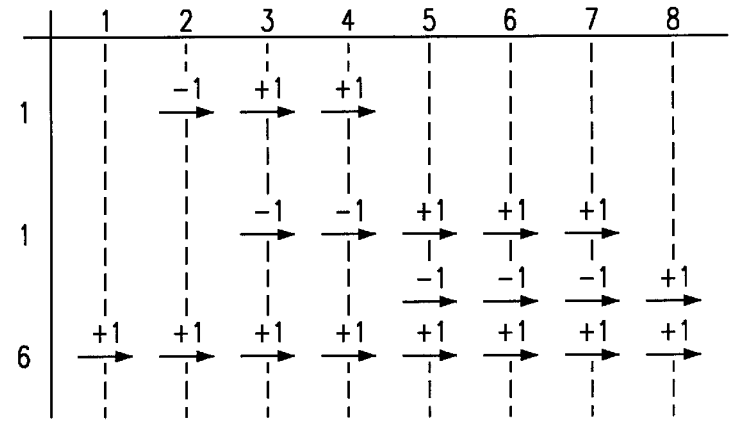
FIG. 8 illustrates a graphical representation of the selection of the DAC elements for a conversion sequence for a second order system.

Referring now to FIG. 8, there is illustrated a diagrammatic view of element selection for a second order conversion. In the second order conversion technique, which was suggested by the Henderson article, a memory is required, i.e., it requires the system to look backwards two cycles and account for the noise associated therewith. To explain this, an example is set forth for second order DWA noise-shaping response wherein the conversion cycle or sequence is a "1," followed by a "1" followed a "6." In the first conversion for a "1," a determination is made that a −1 value must be represented for the second element and a +1 value must be represented for elements 3 and 4, the derivation of this being described hereinbelow. In the next element, the positive error values for elements 3 and 4 from the previous conversion cycle are canceled with −1 values for elements 3 and 4. Of course, this will require a net positive value of +3 and this will be achieved by selecting the next 3 elements, 5, 6, and 7, with a +1 value for a total of +1. In the next conversion cycle for the value "6," the positive values for the elements 5, 6, and 7 are canceled out by associating a −1 value for elements 5, 6, and 7. This will yield a total of −3 which must be compensated for with a total value of +9. This will require clement 8 to have a +1 associated therewith and then subsequently associate a +1 value on elements 1 through 8 again. Therefore, elements 1 through 8 would have a virtual second pass associated therewith with a +1 value. This results in all elements being selected with the total value for elements 1–4 being a +1, the elements 5–7 being a "0" and the value for 8 being a +2. This will result in the DAC element selection value of "1, 1, 1, 1, 0, 0, 0, 2."

In order to describe the concept in more detail, pointers are defined, which pointers represent each of the elements, there being "8" elements. There are three pointers, $t_0$, $t_1$ an $t_2$, $t_0$ representing the scalar value of the sum of the 8 elements $t_0(i)$, the contribution from the cycle before the previous conversion cycle, $t_1$ representing the scalar value of the sum of the 8 elements $t_1(i)$, the noise contribution from a previous conversion cycle and $t_2$ representing the scalar value of the sum of the i elements $t_2(i)$ and the noise contribution from the current conversion cycle. Each element has an error of $\delta_i$, where the value of i varies from 1 through 8.

Figure 9:
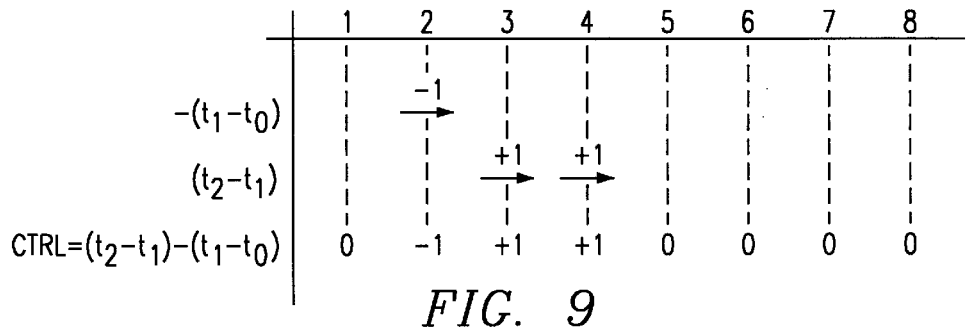
FIG. 9 and FIG. 10 illustrate a diagrammatic view for selection of the DACs for a second order system illustrating the pointers.

With reference to FIG. 9 and the diagram associated therewith, the conversion of the value "1" is illustrated, with knowledge that the previous pointer $t_1$ is equal to "2" and to equals "1." By inserting the noise parameters relative to the pointers, the noise equation will be translated to:

$$CTRL=t_2-2t_1+t_0 \qquad (5)$$

wherein CTRL represents as a scalar value of the sum of the 8 elements CTRL(i) the final DAC element control values and equals the modulator output, i.e., if the modulator output is 2, then at least two elements must be turned on or selected or the total sum of the elements must be 2.

With further reference to FIG. 9, it can be seen that the second element has associated therewith a −1 which represents the difference between the conversion cycle for to and the conversion cycle for $t_1$. This was a +1 in the previous conversion cycle and, in the current conversion, it will require a −1 value to account therefore. The difference between the current cycle and the previous cycle requires a +1 value at element 3 and a +1 value at element 4 to result in a total value of+1. This will result in the control value of "0, −1, +1, +1, 0, 0, 0, 0."

Figure 10:
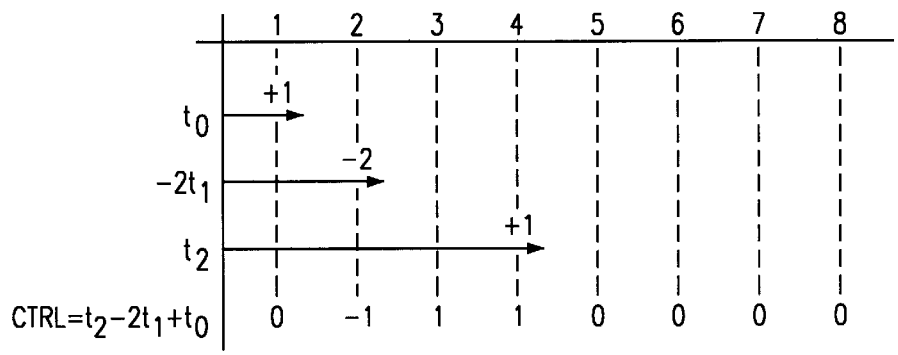

With reference to FIG. 10, the pointers are drawn as extending from element 1 all the way through to the highest element associated therewith. It can be seen that to will only require a +1 value for the first element, with $t_1$ requiring +1 values for elements 1 and 2, there being a −2 multiplier associated therewith. The value for $t_0$ and $t_1$ are known from the previous two cycles and the current CTRL value is known to be a +1 such that the value of $t_2$ can be determined. Element $t_2$ would be +1=$t_2$−4+1, with $t_2$ being equal to +4. This would require that a value of +1 were assigned to each of the first four elements. This would result in CTRL (i) being "0, −1, 1, 1, 0, 0, 0, 0." It can be seen that this reveals the true nature of the second order noise shaping with the noise equation: $n(k)=n_2(k)-2n_1(k)+n_0(k)$, with $n_2(k)=\delta_{1-4}$, $n_1(k)=\delta_{1-2}$, and $n_0(k)=\delta_1$. When these are added up, this will result in the value of +1 being assigned to the value for the conversion as CTRL.

Figure 11:
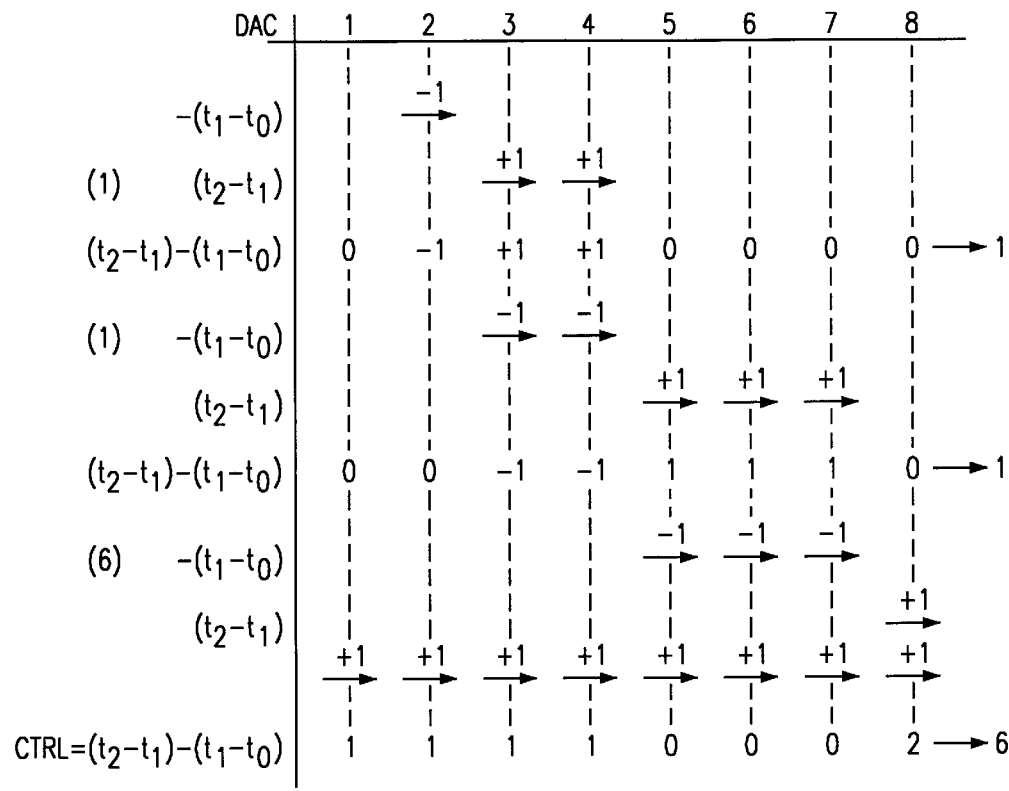
FIGS. 11 and 12 illustrate a conversion operation between three values for the second order noise response.
Figure 12:
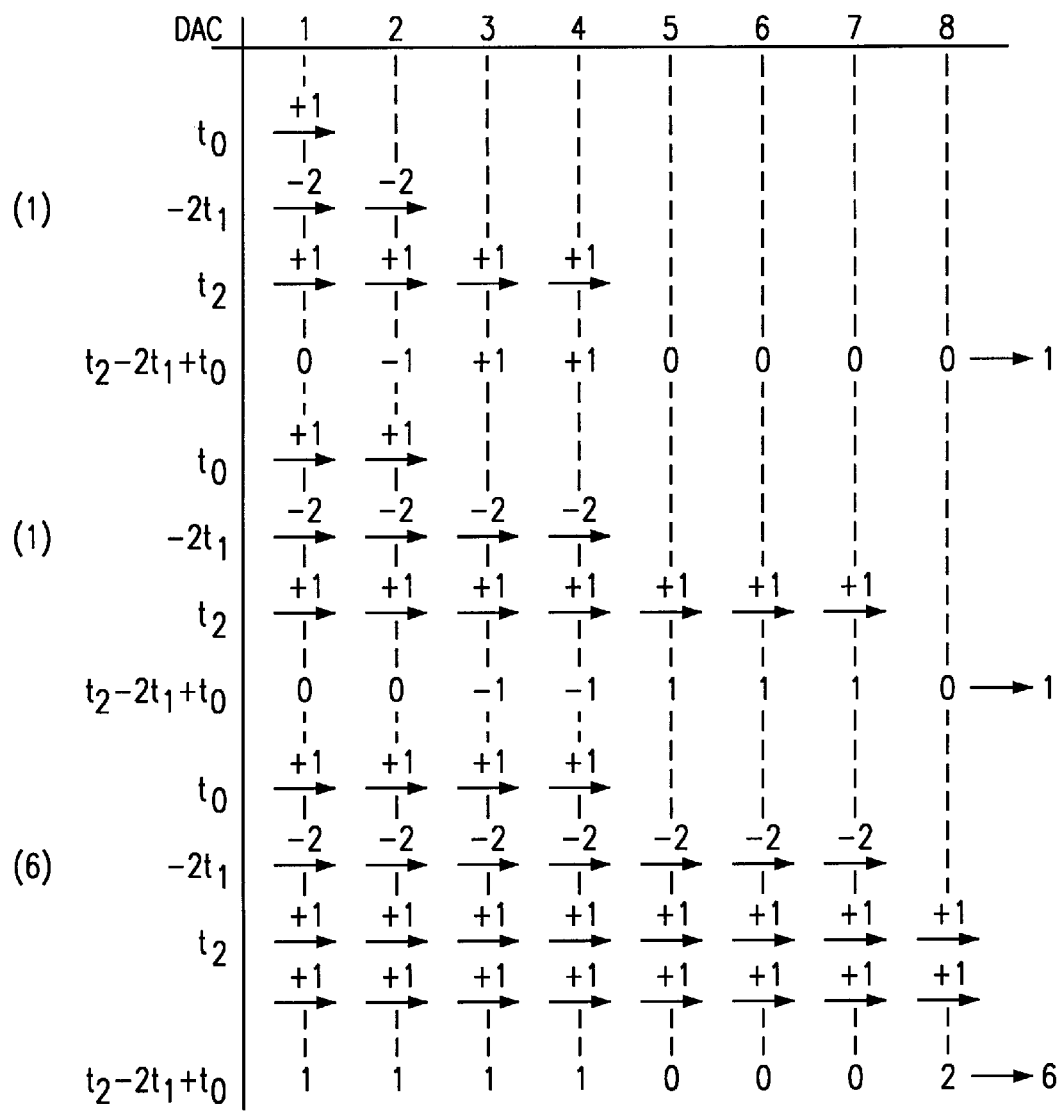

Following from the above-noted example of FIGS. 9 and 10 for generating the value of "1," FIGS. 11 and 12 illustrate diagrammatic views for the sequence of converting from the value of "1" to a value of "1" followed by a value of "6." The first three lines in FIG. 11 illustrate the conversion of the value of "1" as illustrated in FIG. 9. The next conversion, that to a "1," requires that the positive values that were set in the previous conversion in the $(t_2-t_1)$ line be carried forward to the $-(t_1-t_0)$ in the current conversion. This results in a −1 value in both elements 3 and 4. Since the conversion data is a value of "1," there must be three positive elements provided which will be the cyclic elements, elements 5, 6 and 7. This will yield the control value "0, 0, −1, −1, 1, 1, 1, 0." In the next conversion cycle, that to a value of "6," the positive values in the previous conversion, that associated with $(t_2-t_1)$ will be reflected as negative values, that being the −1 value for elements 5, 6 and 7. This yields a value of "−3." This must be compensated for with at least nine +1 values. This will result in the element 8 having a +1 value associated therewith and then cyclically going back and setting the value of elements 1 through 8 to a positive value. When these are added up, this will result in the CTRL(i) being "1, 1, 1, 0, 0, 0, 2." This yields a total value of 6. It is important to note one aspect of the above, that being, in order to realize the control word having either a value of −1 or a value of 2, this requires more than two states of "0" and "1." This will require that the DAC element need to connect to $+V_{REF}$, ground and $-V_{REF}$. To arrive at the value of "2," will require two passes through the system, i.e., this will require element 8 to be selected twice to get the summing value therefore.

FIG. 12 illustrates the diagrammatic view wherein the specific pointers $t_0$, $t_1$, and $t_2$ are set out. The first three lines representing the first conversion to a "1" is illustrated in FIG. 10. When converting from the value of "1" to the next value of "1," it can be seen that the to pointer for the current conversion is identical to the $t_1$ pointer value for the previous conversion; that is, a +1 value for both elements 1 and 2. The $t_1$ value is basically the $t_2$ value for the previous conversion; that is, a "+1" for each of elements 1, 2, 3 and 4 with a −2 multiplier. Once the values of $t_0$ and $t_1$ are known, the value for $t_2$ can be determined from the following:

$$t_2 = CTRL + 2t_1 - t_0 \quad (6)$$

where $$t_2 = (1) + 2(+4) - (+2) = 7 \quad (7)$$

This requires that there be seven +1 elements, which are elements 1 through 7. Therefore, knowing the value of $t_0$– the value of $t_1$ from the previous cycle and the value of $t_1$– the value of $t_2$ for the previous cycle, then the value of $t_2$ in the new conversion cycle can be determined.

In the next conversion cycle, that for the value of "6," the value of to is a +1 value for elements 1 through 4, this reflecting the value of $t_1$ in the previous conversion cycle. The value of $t_1$ reflects the value of −2 for elements 1–7, reflecting the value of $t_2$ in the previous conversion cycle. From the above, $t_2$ can be calculated with a value of "6" as +1 6. This results in elements 1 through 8 being "turned on" or selected for two passes.

Although the next conversion is not illustrated, it would require the value of $t_1$ in the conversion cycle for the element "6" to be reflected as the new $t_0$, and the value of $t_2$ in the conversion cycle for the element "6" to be reflected as the new $t_1$. However, since all 8 elements are selected in each pass for $t_2$, there is no reason to reflect this value since the noise contribution when all 8 elements are selected is zero and, therefore, it is not necessary to cancel out this level of the noise, such that it can be ignored.

From the above, a noise analysis can be performed. This noise analysis will be as follows:

$$n(1) = n_2(1) - 2n_1(1) + n_0(1) \quad (8)$$

with $$n_2(1) = \delta_{1 \to 4},\ n_1(1) = \delta_{1 \to 2},\ \text{and}\ n_0(1) = \delta_1 \quad (9)$$

$$n(2) = n_2(2) - 2n_1(2) + n_0(2) \quad (10)$$

with $$n_2(2) = \delta_{1 \to 7},\ n_1(2) = \delta_{1 \to 4},\ \text{and}\ n_0(2) = \delta_{1 \to 2} \quad (11)$$

and $$n(3) = n_2(3) - 2n_1(3) + n_0(3) \quad (12)$$

with $$n_2(3) = 2\delta_{1 \to 8} = 0,\ n_1(3) = \delta_{1 \to 7},\ \text{and}\ n_0(3) = \delta_{1 \to 4} \quad (13)$$

There are three things that can be noted from the above noise analysis. First, the noise equation is preserved and, in fact, if the convention is maintained that $t_1$ and $t_0$ of the current conversion correspond to $t_1$ and $t_2$ of the previous conversion, respectfully. At each conversion, all that is necessary is to construct the new value of $t_2$. Secondly, it can be noticed that cancellation is obtained in the noise when all of the elements are selected as in $n_2(3)$. Without this, noise will keep growing. In this instance, as noted hereinabove, it is necessary to have a uniform element selection in $t_2$ and not in CTRL. Based upon the DWA method, uniform element selection in CTRL only generates first order noise shaping. Thirdly, element number 8 is required twice and both will contribute positively when converting the value of "6." As will be described hereinbelow, to avoid this, elements 5, 6 or 7 should be chosen. Also, as will be described hereinbelow, it is not important which of the elements 5, 6 or 7 are chosen (for this particular case), other than the choice merely needs to be for the purpose of a certain element to be chosen in the CTRL value. Therefore, the manner that is utilized in the present disclosure is to select the smallest $t_2(i)$ value that has not been utilized in the CTRL(i), where "i" varies from 1 through 8. For example, in the above noted case in FIG. 12, element 8 cannot be substituted with any of elements 1 through 4, since this will result in utilizing the CTRL value for that element twice and both providing a positive contribution. Since $t_2(5) = t_2(6) = t_2(7) = 2$, it does not matter which one of the elements 5, 6 or 7 are chosen. However, if $t_2(5) = 1$, $t_2(6) = 2$ and $t_2(7) = 3$, then the element 5 would have to be chosen to achieve maximum possible uniform element selection in $t_2$.

To further the idea of minimizing the selections, the present disclosure teaches the avoidance of "−1" value in the control signal. This, together with the avoidance of the "2" value of course, does not allow for uniform element selection in $t_2$ and, therefore, it takes a longer time to obtain noise cancellation. The length of time translates into the frequency where the noise shaping starts to become flat.

Figure 13:
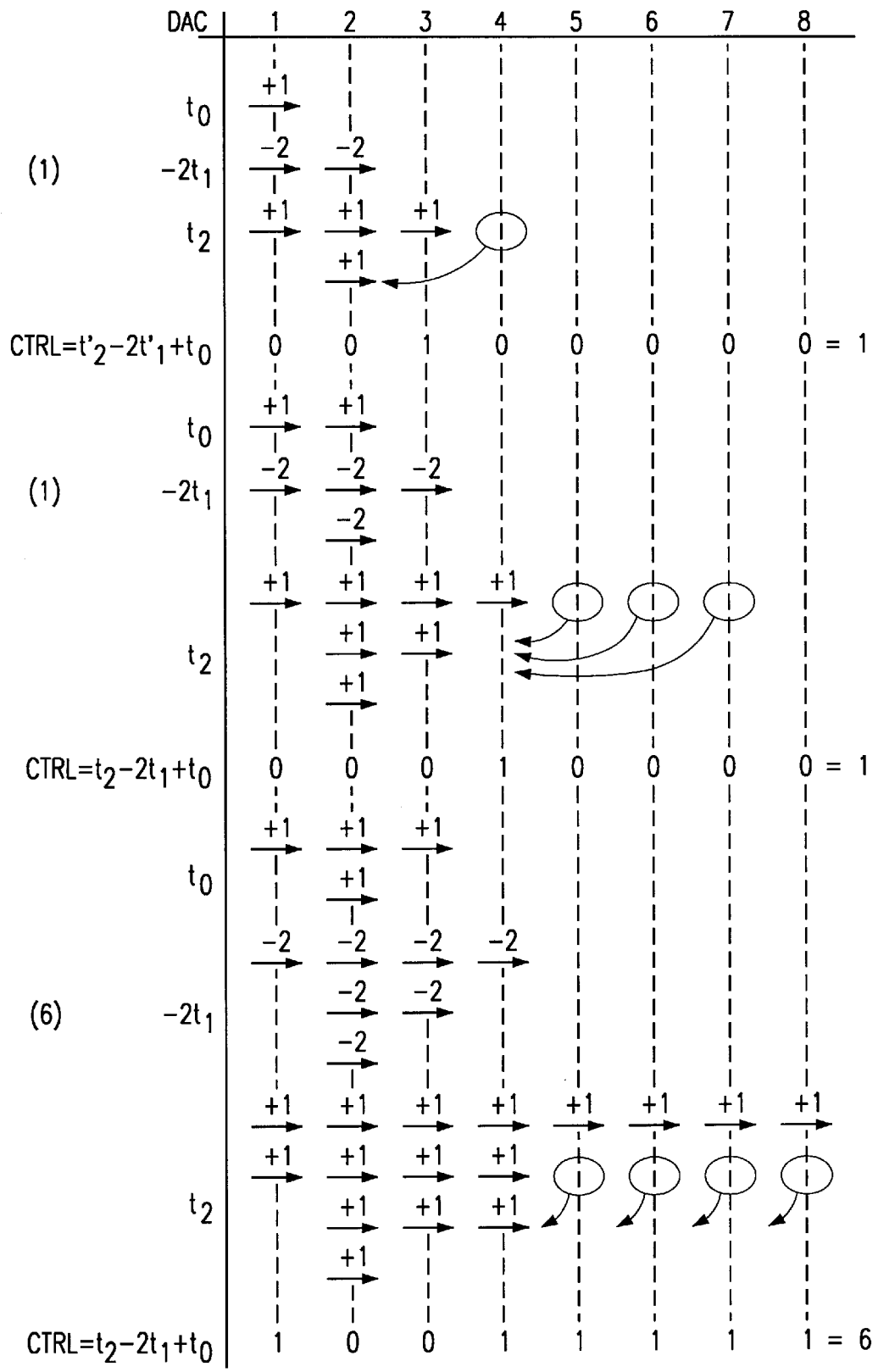
FIG. 13 illustrates the conversion operation with the distortion for restricting the output values.

Referring now to FIG. 13, there is illustrated a modification of the diagram of FIG. 12 wherein the values for $t_2$ or the values for the pointers are changed to prevent the control signal from having a −1 value or a +2 value. To facilitate this, the pointer for $t_2$ is adjusted such that the element previously selected is FIG. 4 will be moved to element 2 first in order to cancel the −1 value. In the next conversion cycle, that for the next value of "1" the value of $t_2$ is carried through to the value of $t_1$ and it can be seen that there are two +1 values for element 2, which correspond to a −2 value when multiplied by 2 and then $t_2$ must be adjusted. The value of $t_2$ is equal to 7, but the conversion technique of FIG. 1 is modified such that the previously selected elements 5, 6 and 7 are now selected for element 2 and 3 and element 2, such that element 2 is selected three times and element 3 is selected two times. This results in a cancellation of the −1 value previously noted in element 3 and the −1 value previously noted in element 4 in the control signal. This will then follow on to the conversion of element 6 wherein the previous $t_1$ is carried forward to to and the previous $t_2$ is carried through to $t_1$. It is the adjustment of these values that eliminates the occurrence of a value "2" in the control signal or a value of "−1" in the control signal. This prevents, for the −1 value, the requirement of a −1 selection voltage and, for the "+2" value, the selection of an element twice in two passes. Tests have been performed on this technique wherein uniform selection is not achieved and this shows a +/−1.4% element mismatch can be tolerated, to achieve a −120 dB integrated noise over the frequency band of DC to 40 kHz with the DAC operating at 6.144 MHz.

It is important to note that the above-noted discussion is with respect to a second order system. This can easily be applied to a first order noise shaping system wherein CTRL= $t_1-t_0$ and for a third order noise shaping system, CTRL=$t_3-3t_2+3t_1-t_0$. This corresponds to the previously made frequency domain representation $(1-z^{-1})^3$. For the first order noise shaping system, the above technique provides perfect, nondistorted first order noise shaping.

Figures 14, 15:
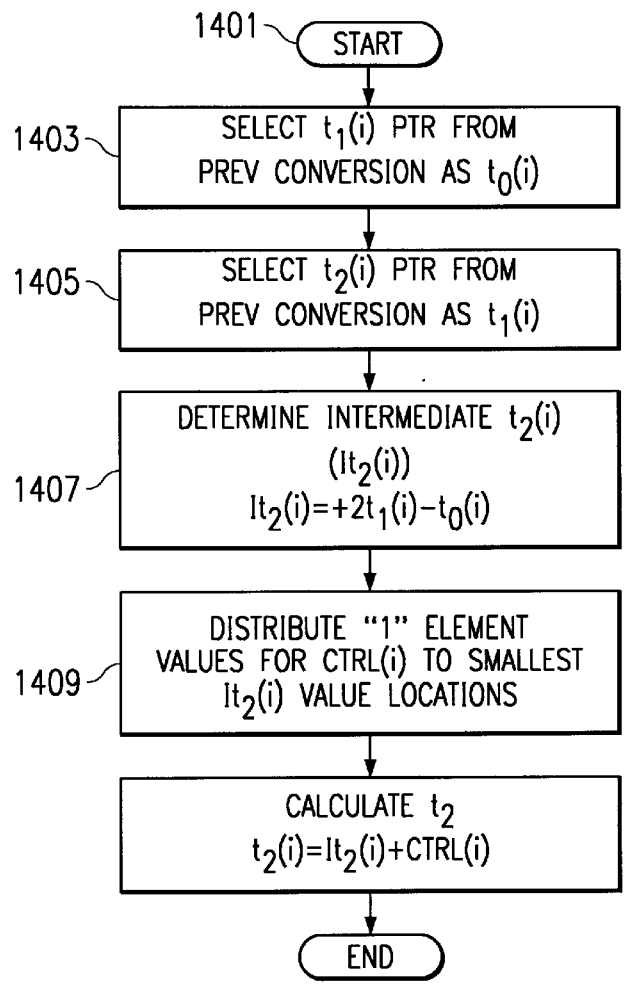
FIG. 14 illustrates a flowchart for the implementation of the conversion algorithm.
FIG. 15 illustrates a diagrammatic view of the flowchart of FIG. 14.

Referring now to FIG. 14, there is illustrated a flow chart for the implementation of the element matching algorithm. The program is initiated at a block 1401 and then proceeds to a function block 1403. In function block 1403, the $t_1(i)$ pointer from the previous conversion is selected as $t_0(i)$ of the current conversion. The program then flows to a function block 1405 wherein the $t_2(i)$ pointer is selected from the previous conversion and substituted as the $t_1(i)$ pointer for the current conversion cycle. The program then flows to a function block 1407 wherein $t_2$ is determined. In the present algorithm, an intermediate $t_2(i)$ ($It_2(i)$) is defined. This is defined under the condition that the CTRL(i) signal is "0, 0, 0, 0, 0, 0, 0, 0." Therefore, the following relationship would exist for the intermediate pointer:

$$It_2(i)=0+2t_1(i)-t_0(i) \qquad (14)$$

Therefore, the value of $It_2(i)$ is determined in terms of $t_1(i)$ and $t_0(i)$ only. Once this intermediate $t_2(i)$ value is defined, the program will flow to a function block 1409 wherein the step of distributing the "1" element values for the CTRL desired value will be performed such that they will be distributed to the smallest $It_2(i)$ value locations. Since the scalar CTRL value is known, it is known how may "0" and "1" values will be required, keeping in mind that the restrictions are that the values can only be those two values. There is no "−1" or "+2" values. Therefore, once the "1" and "0" values are distributed in the CTRL(i)signal selecting the smallest $It_2(i)$ value locations, this will result in a CTRL(i) value which can then be added to $It_2$ to yield a new $t_2(i)$ value, as indicated by a block 1411. With this new $t_2$ value, it can be ensured that the second order nature of the noise shaping is retained, while maximum possible uniform element selection for $t_2(i)$ is achieved while also ensuring that the values in the CTRL(i)signal are limited to "1" and "0."

As an example of the above-noted process, reference is now made to the diagrammatic view of FIG. 15. In FIG. 15, it is assumed that the $t_1(i)$ and $t_2(i)$ values from the previous conversion cycle that are transposed to the $t_0(i)$ and $t_1(i)$ pointer values of the current conversion yield and $It_2(i)$ of "−1, 1, −3, 0, 1, 2, 3, −2." If the value of "3" is desired for the CTRL signal, this will require three "1" values to be disposed therein. In examining this, the minimum values of $It_2$ will be −1, −3 and −2. This will yield a CTRL(i)signal of "1, 0, 1, 0, 0, 0, 0, 1." When this value is added to $It_2(i)$, this will yield a $t_2(i)$ of "0, 1, −2, 0, 1, 2, 3, −1." With this technique, the values in $t_2(i)$ are aligned in such a manner that there are no values other than "0" and "1" in the CTRL(i)signal. A complete search may be too expensive to realize with current technology and, therefore, the implementation described hereinbelow will be an incomplete search scheme.

Figures 16, 17:
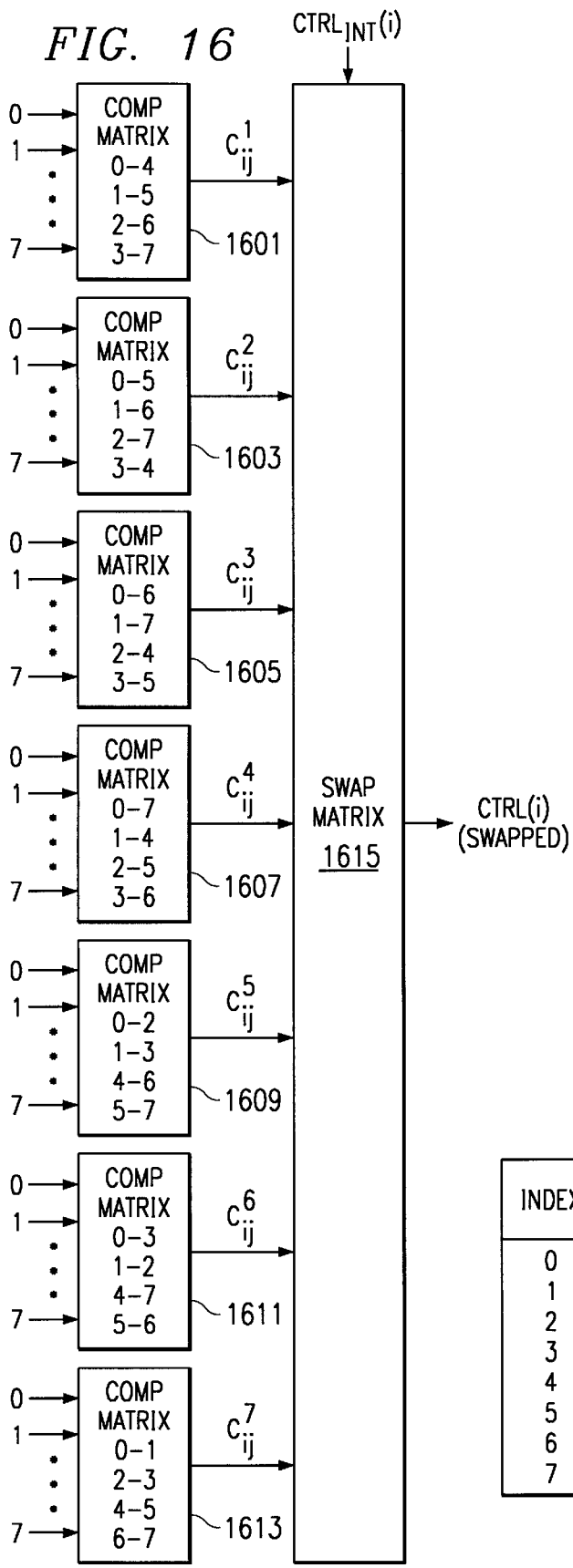
FIG. 16 illustrates a block diagram of the comparator matrix operation.
FIG. 17 illustrates a diagrammatic view of the operation of one iteration of the matrix of FIG. 16.

Referring now to FIG. 16, there is illustrated an implementation in hardware of the above-noted algorithm for selecting elements utilizing the incomplete search scheme. There are provided seven comparator matrices 1601, 1603, 1605, 1607, 1609, 1611 and 1613, each of the comparator matrices operable to compare two of the $t_2(i)$ values received on the input, there being 8 elements in this vector value. This will result in an output $C_{IJ}^{1}$ from comparator matrix 1601, an output $C_{IJ}^{2}$ output from comparator matrix 1603, a $C_{IJ}^{3}$ output from comparator matrix 1605, an output $C_{IJ}^{4}$ output from comparator matrix 1607, an output $C_{IJ}^{5}$ output from comparator matrix 1609, an output $C_{IJ}^{6}$ output from comparator matrix 1611 and an output $C_{IJ}^{7}$ output from comparator matrix 1613. The comparator matrices 1601–1613 are each operable to compare two values and output four outputs. In comparator matrix 1601, the comparison is made such that inputs 0,4 are compared, inputs 1,5 are compared, inputs 2,6 are compared and inputs 3,7 are compared. The comparison is such that there will be a true output if the first value is larger or equal to the second value, and a "0" output if the second comparator value is larger. The purpose of the comparator matrices 1601–1613 is to determine which of the two values compared for each of the comparison operations therein is the smaller value and reflect this in the output. Comparator matrix 1603 provides comparisons between 0 and 5, 1 and 6, 2 and 7, and 3 and 4. The comparator matrix 1605 compares the inputs 0 and 6, 1 and 7, 2 and 4, and 3 and 5, respectively. The comparator matrix 1607 compares the values 0 and 7, 1 and 4, 2 and 5, and 3 and 6, respectively. The comparator matrix 1609 compares the values 0 and 2, 1 and 3, 4 and 6, and 5 and 7, respectively. The comparator matrix 1611 compares the values 0 and 3, 1 and 2, 4 and 7, and 5 and 6, respectively. The comparator matrix 1613 compares the values 0 and 1, 2 and 3, 4 and 5, and 6 and 7, respectively.

Each of the comparator matrices 1601–1613 is utilized in a single iterative operation, such that the output of comparator matrix 1601 is utilized first, that of comparator matrix 1603 utilized second, that of comparator matrix 1605 utilized third, that of comparator matrix 1607 utilized fourth, that of comparator matrix 1609 utilized fifth, that of comparator matrix 1611 utilized sixth and that of comparator matrix 1613 used last. The outputs of each of the comparator matrices 1601–1613 are input to a swap matrix 1615, which is operable to receive an intermediate control value having the first "CTRL" elements set to a value of "1" and the remaining set to a value of "0." The swap matrix 1615, as will be described hereinbelow, iteratively swaps the values of "1" such that they are associated with the lower of one of the two compared values. After seven iterations, this will output the desired control signal, CTRL, with the appropriate values associated therewith.

Referring now to FIG. 17, there is illustrated a diagrammatic view of a single iteration showing the operation of the swap matrix 1615. In this diagrammatic view, there is provided an index value from 0 through 7 for the $t_2(i)$ input. The intermediate $t_2(i)$, $It_2(i)$, that is associated with this particular conversion is "1, −2, 1, 2, 0, −3, 2, 1." The value to be converted is "3." In the first iterative step, $It_2(0)$ will be compared with $It_2(4)$, which will compare a "1" with a "0", and the value for $C_{ij}^{-1}(0)$ will be a "1", this indicates a swap. For the next comparison, $It(1)$ will be compared with $It_2(5)$ which will compare a "−2" with a "3", the value for $C_{ij}^{-1}(1)$ will be a "1", this indicating a swap. In the next comparison, $It_2(2)$ will be compared with $It_2(6)$ which will compare a "1" with a "2", and the value for $C_{ij}^{-1}(2)$ will be a "0". This indicates a no swap condition. In the next comparison, $It_2(3)$ will be compared with $It_2(7)$ which will compare a "2" with a "1", and the value for $C_{ij}^{-1}(3)$ will be a "1", this indicating a swap condition, but since $CTRL_{INT1}$(3) and $CTRL_{INT1}$(7) are both 0, it doesn't matter whether it is a swap or non-swap condition. This results in a $CTRL_{INT2}$ value of "0,0,1,0,1,1,0,0." Note that a "1" value for $C_{ij}^{-1}(i)$ doesn't always indicate a swap. The goal is to put "1" values in $CTRL_{INT1}(i)$ to the locations where $It_2(i)$ are smaller in the comparison pair.

This iteration will continue for six more iterations utilizing the $C_{IJ}$ outputs of the comparator matrices 1603–1613, sequentially. The intermediate control value will continually be changed and the values therein swapped to provide the final CTRL(i) signal. This basically provides a minimum value search for $It_2(i)$. In some cases, with this method, some "1" values are put at the locations where $It_2(i)$ are not smaller than others. This may result in an even less uniform element selection in $t_2$ and, therefore, some degradation in performance. However, this performance has been noticed in simulations to be less than 3 dB of degradation.

Figure 18A:
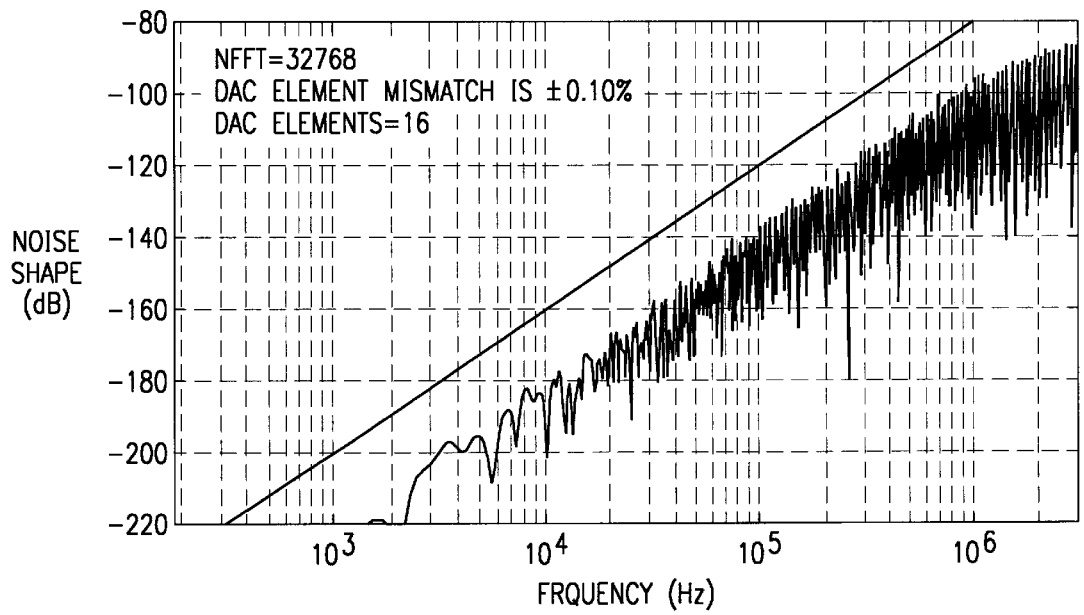
FIGS. 18a and 18b illustrate plots for the $2^{nd}$ order DWA method.
Figure 18B:
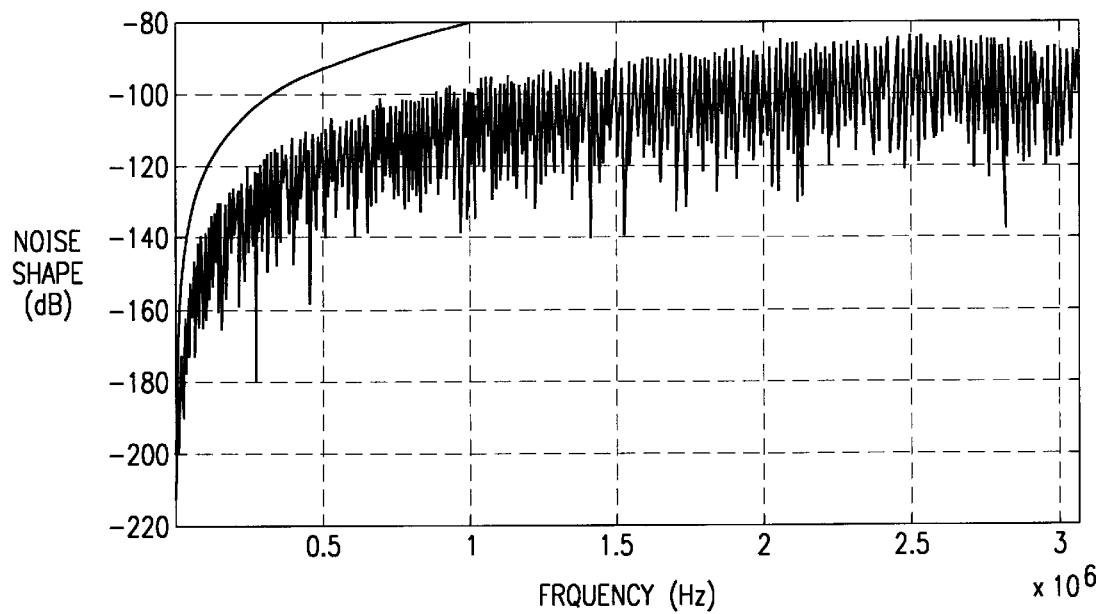
Figure 19A:
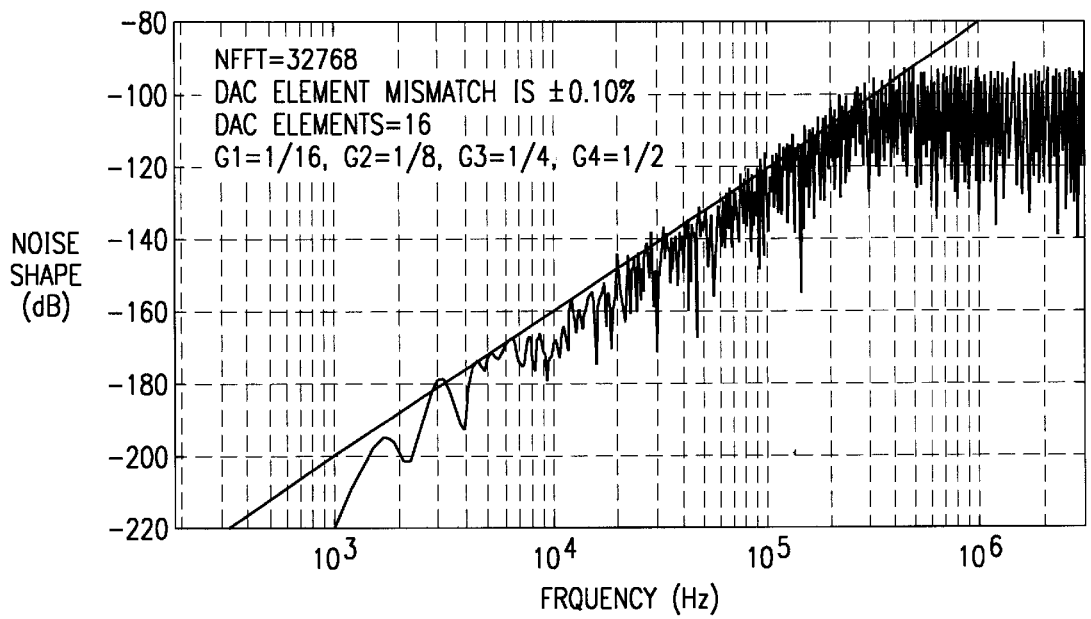
FIGS. 19a and 19b illustrate plots for a prior art method.
Figure 19B:
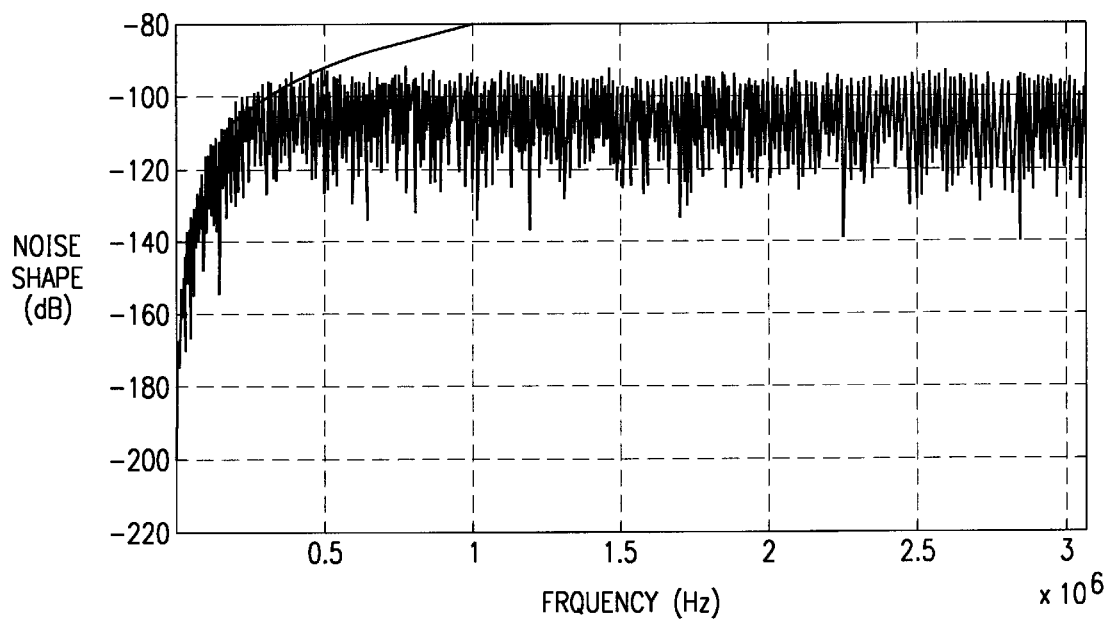
Figure 20A:
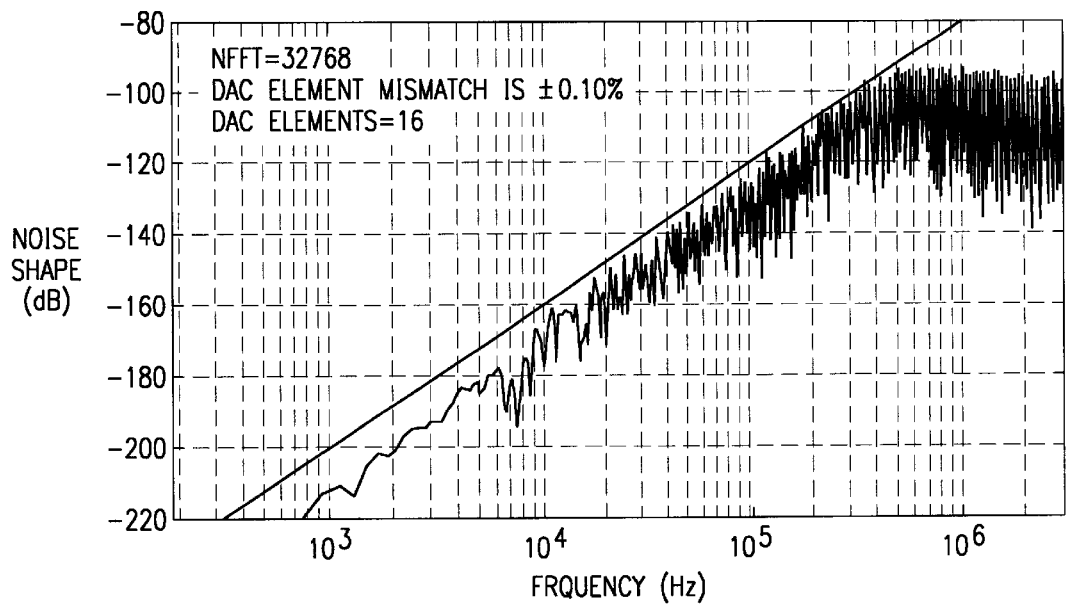
FIGS. 20a and 20b illustrate plots for the constrained $2^{nd}$ order DWA method.
Figure 20B:
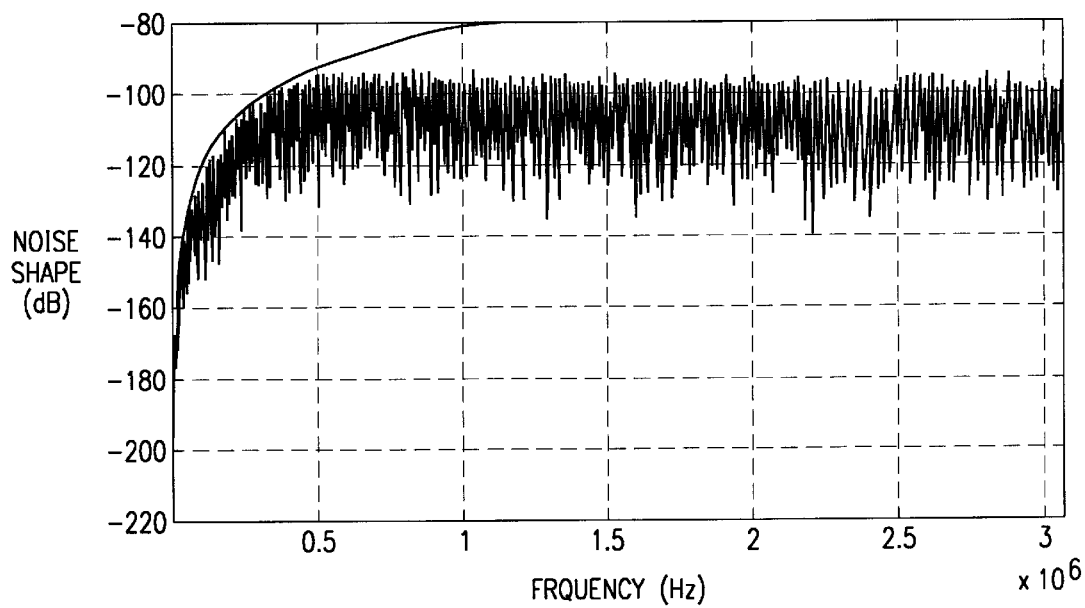

Referring now to FIG. 18A and 18B, there are illustrated plots in both semi-log and linear formats of the frequency analysis of noise of the data weighted averaging (DWA) method. The straight line in the semilog plot of FIG. 18A illustrates the second order noise shaping slope. All frequency analyses are made with 32,768 points and all simulations utilize a 16 level DAC and +/−0.1% element mismatch and the input to the DAC is a 16 level random number. FIGS. 19A and 19B illustrate the same approach utilizing Galton's method and FIGS. 20A and 20B illustrate the method utilizing the current constrained DWA method wherein the elements are altered slightly from the DWA method to prevent values other than "0" or "1" being utilized. It is noted in the DWA method of FIGS. 18A and 18B that noise shaping follows the second order slope up to $F_s/2$ (3.072 MHz). In Galton's method, FIGS. 19A and 19B, the frequency response initially appears to be second order noise shaped, but then flattens out at a frequency of around 300 kHz. The vows in the Galton paper are labeled G1 through G4 which are illustrated on FIG. 19A as a scaling factor is needed and optimized for different delta-signal modulators located at different binary tree stages. In the constrained DWA associated with the current disclosure in FIGS. 20A and 20B, the frequency response is initially second order noise shaped and then flattens out over a frequency of around 500 kHz and, therefore, its in-band noise performance is better than that of Galton.

Figure 21A:
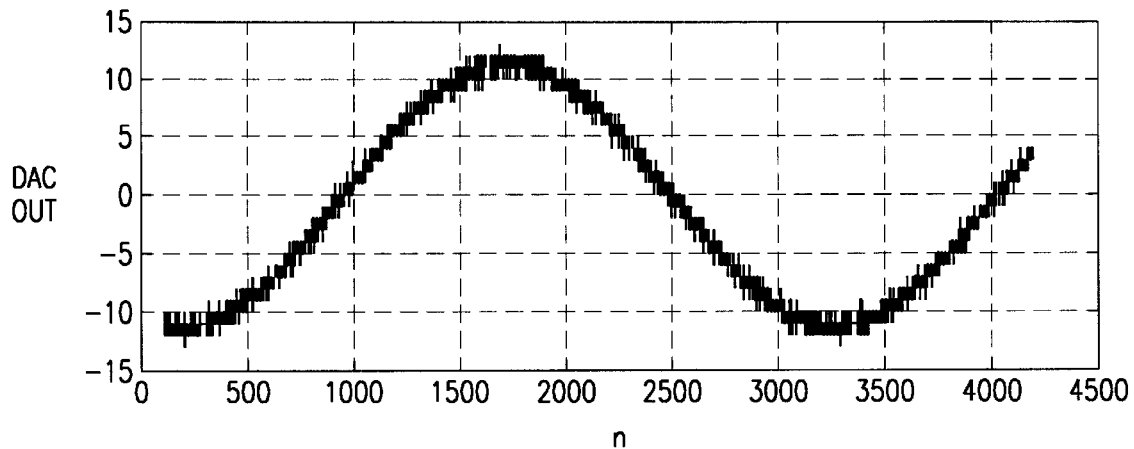
FIGS. 21a–21c illustrate plots for the constrained DWA method driven by a modulator.
Figure 21B:
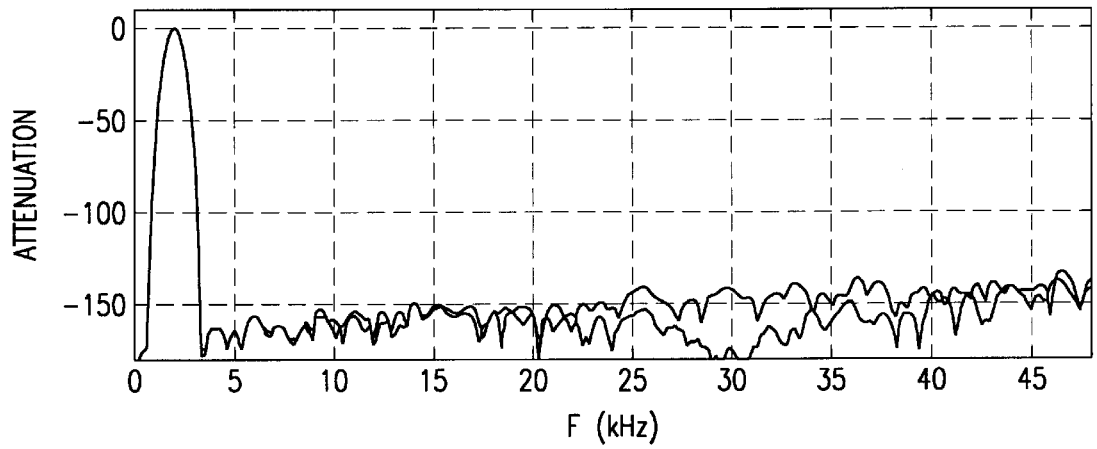
Figure 21C:
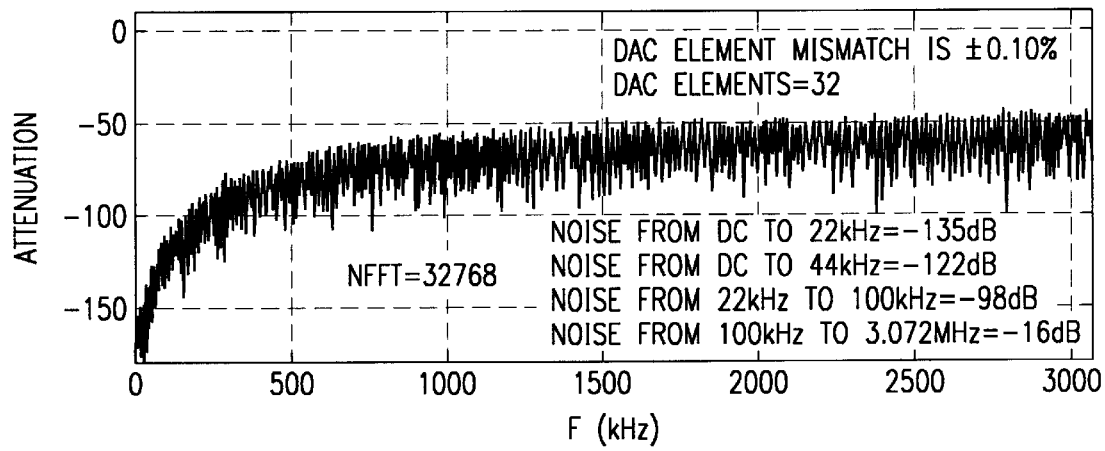

Referring now to FIGS. 21A–21C, there is illustrated the output of a DWA DAC driven by a third order modulator overlapped by the modulator output utilizing the noise shaping constrained DWA method of the present disclosure. In this simulation, the input to the modulator is 2 kHz full scale sign wave, DAC element mismatch is +/−1%, with the DAC having 32 elements. The number of points in the frequency analysis is, as noted hereinabove, 32,768. Of all of the three processes in FIG. 21, only from the inband frequency plot of FIG. 21B can the difference between the modulator's output and the DAC's output be seen. Also, the modulator's output illustrates a zero placed around 30 kHz, while the DAC's output shows no non-DC zeros.

Figure 22A:
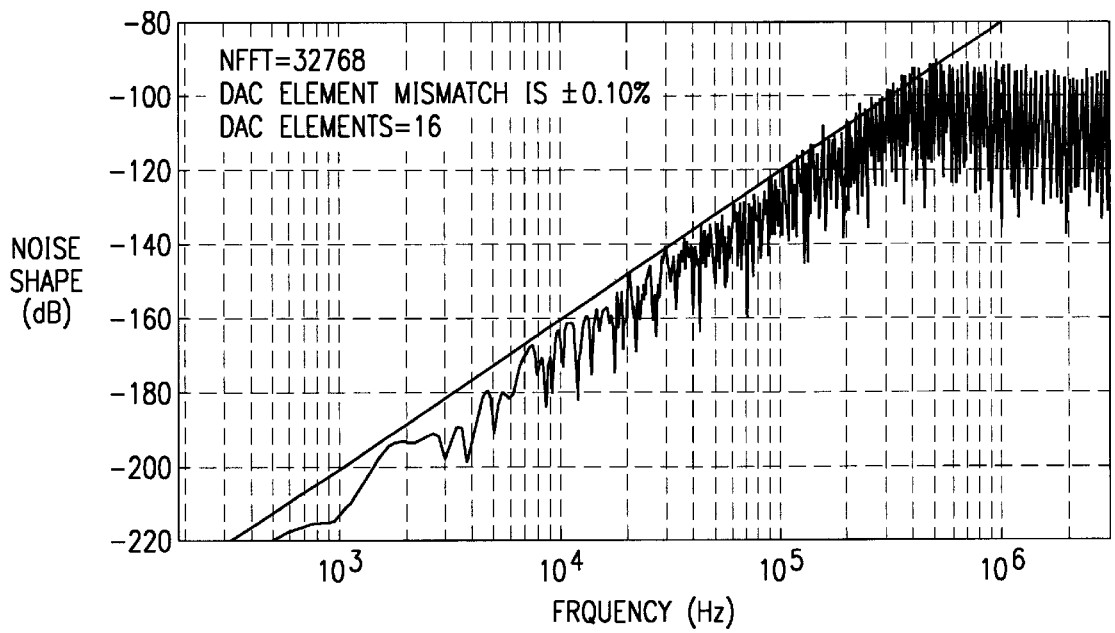
FIGS. 22a and 22b illustrate the constrained DWA method with an incomplete search.
Figure 22B:
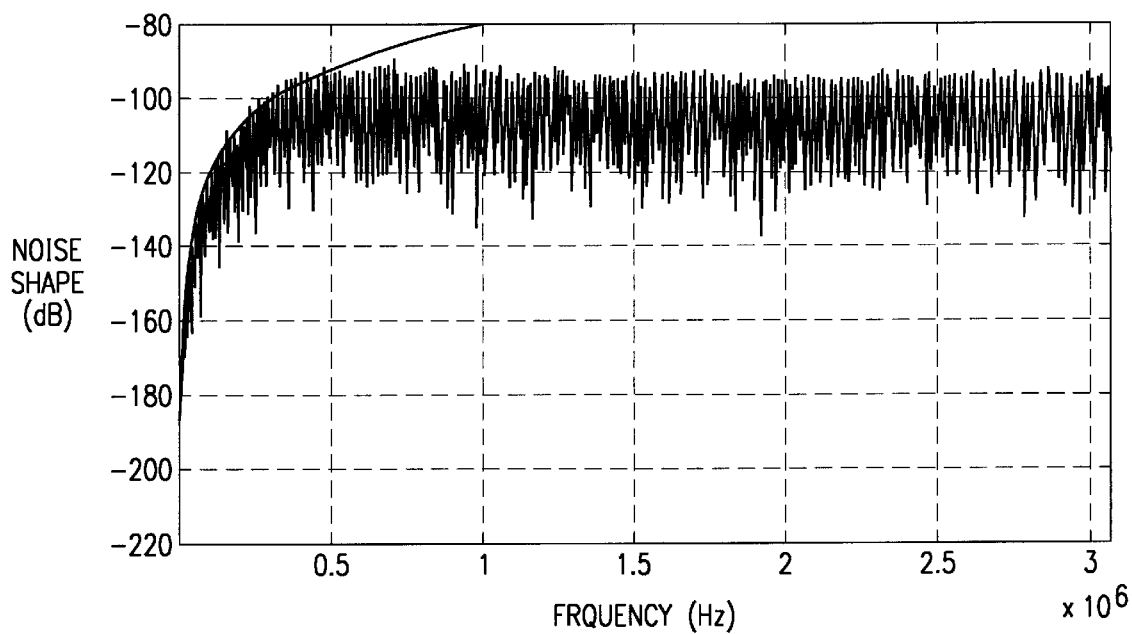
Figure 23A:
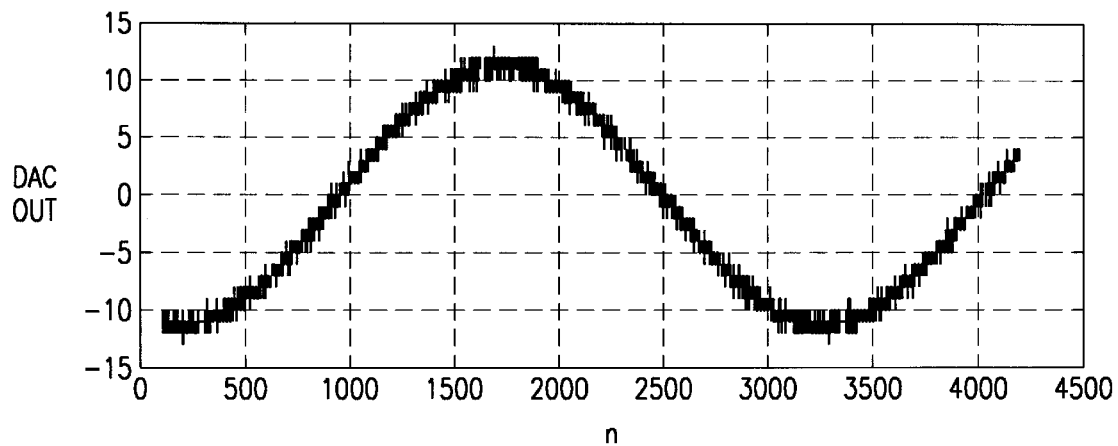
FIGS. 23a–23c illustrate plots for the DWA method with incomplete search driven by a modulator.
Figure 23B:
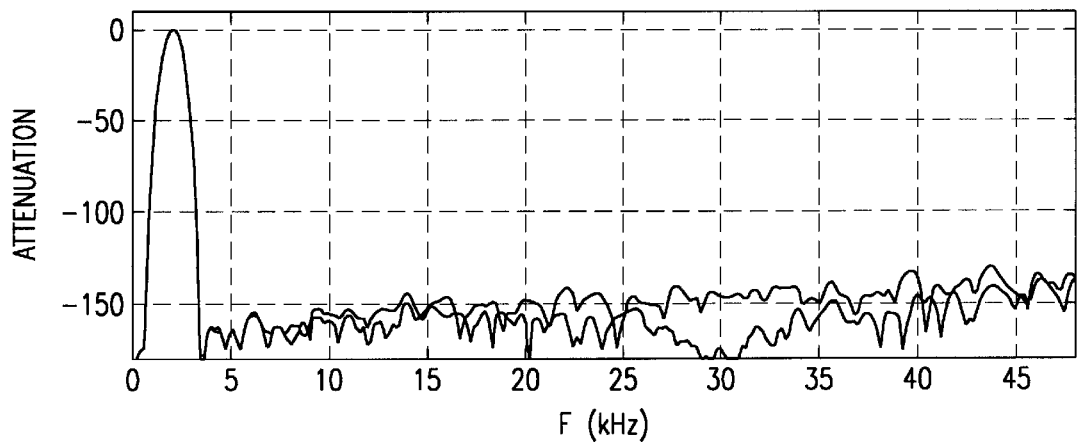
Figure 23C:
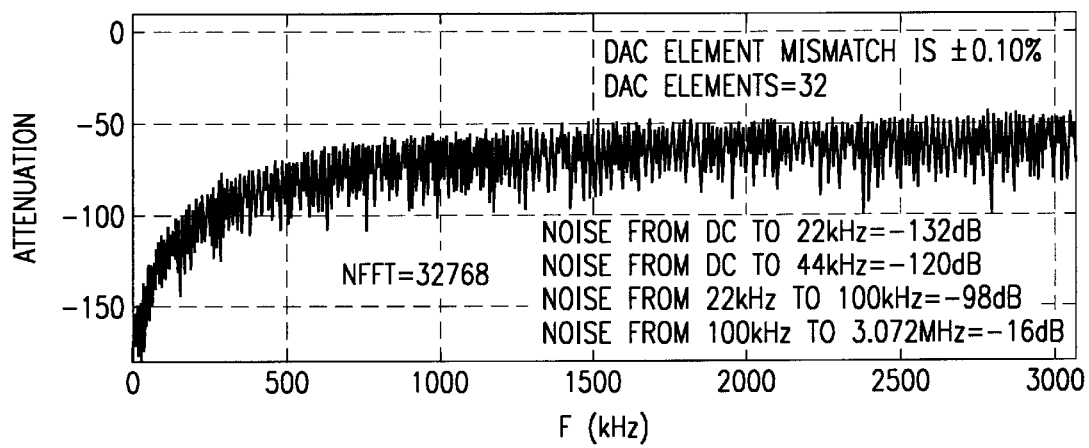

FIGS. 22A and 22B correspond to FIGS. 20A and 20B illustrating the constrained DWA method of the present disclosure, but with an incomplete search utilizing the implementation of FIG. 16. It can be seen that the frequency response in the second order noise shaping of FIG. 22A appears to go flat at approximately 400 kHz instead of the 500 kHz of FIG. 20A. In FIGS. 23A–23C corresponding to FIGS. 21A–21C, the response is shown for an incomplete search when the DWA DAC is driven by a modulator. It can be seen that the inband noises degraded by approximately 3 dB.

In summary, there has been provided a technique for noise shaping the response of a multi-bit DAC having mismatched elements through the use of dynamic element matching. The technique utilized is a data weighted averaging (DWA) method wherein constrained uniform selections of the elements is implemented. This element selection is facilitated by choosing the elements to provide a predetermined noise response of either a first order, second order or third order type. When selecting the elements in accordance with a DWA algorithm, the selection is cyclic in nature such that elements that were selected in previous conversion cycles are selected as a last resort in subsequent cycles. Further, if the algorithm selects a "−1" value to subtract noise or requires the element to go through two passes to select the second element, then this element is redistributed in the selection process.

Although the preferred embodiment has been described in detail, it should be understood that various changes, substitutions and alterations can be made therein without departing from the spirit and scope of the invention as defined by the appended claims.

What is claimed is:

1. A method for converting data, comprising the steps of:
   receiving data to be converted in an associated conversion operation;
   processing the data through a multi-bit digital-to-analog conversion operation, including the steps of:
      providing a plurality of digital-to-analog conversion (DAC) elements, each operable to provide one of a plurality of discrete values therefrom,
      selecting the discrete values that are to be output from each of the DAC elements in accordance with the value being converted,
      summing the outputs of the DAC elements for the associated received data,
      the step of selecting operating in accordance with a uniform selection algorithm that noise shapes the response of the digital-to-analog conversion operation, the uniform selection algorithm determining the values of each of the DAC elements for the associated conversion operation, the uniform selection algorithm shaping noise due to mismatching in the DAC elements, and constraining the operation of the uniform selection algorithm during operation thereof to change the values of at least two of the DAC elements from that determined by the uniform selection algorithm to result in a constrained uniform selection operation; and
   outputting the result of the conversion operation.

2. The method of claim 1, wherein the received data is a series of data values to be converted operating in sequential conversion operations.

3. The method of claim 2, wherein the uniform selection algorithm operates based upon at least one previous cycle.

4. The method of claim 3, wherein the uniform selection algorithm has a second order noise shaping response such that it is based upon at least two previous conversion cycles and the noise associated therewith.

5. The method of claim 4, wherein the second order noise shaping response associated with the uniform selection algorithm is constrained by the step of constraining to constrain the results in a modified second order noise shaping response.

6. The method of claim 5, wherein the step of constraining to provide the modified second order response is operable to constrain such that any noise resulting from constraining the outputs to a defined number of states distributes the noise over substantially all of the DAC elements.

7. The method of claim 1, wherein the conversion operation is one that converts digital data to analog data.

8. The method of claim 7, wherein the step of processing the data includes the steps of:
interpolating sampled digital data to a higher oversampled frequency; and
processing the interpolated data through an oversampled delta-sigma modulator prior to processing data through the multi-bit digital-to-analog converter.

9. The method of claim 8, wherein the step of processing the oversampled data through the delta-sigma modulator comprises processing the oversampled data through a multi-bit delta-sigma modulator.

10. The method of claim 7, and further comprising the operation of filtering the output with a low pass filter to filter out out-of-band noise.

11. The method of claim 1, wherein the step of constraining is operable to constrain the DAC elements to define the available states to a number of states that are less than the number of states available to the uniform selection algorithm.

12. The method of claim 11, wherein the step of constraining is operable to constrain the output to only two states.

13. The method of claim 12, wherein the two states are a "0" logic state and a "1" logic state.

14. The method of claim 1, wherein each of said DAC elements is restricted to one of two states.

15. The method of claim 14, wherein the first state corresponds to a logic "0" and the second state corresponds to a logic "1."

16. The method of claim 1, wherein each of the DAC elements is substantially identical except for the mismatches associated therewith.

17. The method of claim 1, wherein each of the DAC elements comprises a switched capacitor.

18. The method of claim 1, wherein the uniform selection algorithm is a data weighted averaging algorithm.

19. A method for converting data, comprising the steps of:
receiving data to be converted in an associated conversion operation, wherein the received data is a series of data values to be converted operating in sequential conversion operations;
processing the data through a multi-bit digital-to-analog conversion operation, including the steps of:
providing a plurality of digital-to-analog conversion (DAC) elements, each operable to provide one of a plurality of discrete values therefrom,
selecting the discrete values that are to be output from each of the DAC elements in accordance with the value being converted,
summing the outputs of the DAC elements for the associated received data,
the step of selecting operating in accordance with a uniform selection algorithm that operates based upon at least one previous cycle and noise shapes the response of the digital-to-analog conversion operation with a second order noise shaping response such that it is based upon at least two previous conversion cycles and the noise associated therewith, the uniform selection algorithm determining the values of each of the DAC elements for the associated conversion operation, the uniform selection algorithm shaping noise due to mismatching in the DAC elements, and
constraining the operation of the uniform selection algorithm during operation thereof to change the values of at least two of the DAC elements from that determined by the uniform selection algorithm; and
outputting the result of the conversion operation;
wherein the noise equation for the uniform selection algorithm is as follows:

$$n(k)=n_2(k)-2n_1(k)+n_0(k)$$

where n(k) is the error of the current conversion cycle and contains three terms $n_2(k)$, $-2n_1(k)$ and $n_0(k)$ with $n_1k=n_2(k-1)$, $n_0(k)=n_1(k-1)$, where $n_2(k-1)$ and $n_1(k-1)$ are 1st and 2nd terms in n(k-1), the error of the previous conversion cycle.

20. A data converter for converting data, comprising the steps of:
receiving digital data to be converted in an associated conversion operation;
a multi-bit digital-to-analog converter operable to process the digital data through a multi-bit digital-to-analog conversion operation, said multi-bit digital-to-analog converter including:
a plurality of digital-to-analog conversion (DAC) elements, each operable to provide one of a plurality of discrete values therefrom,
a selector for selecting the discrete values that are to be output from each of said DAC elements in accordance with the value being converted,
a summing device for summing the outputs of said DAC elements for the associated received data,
said selector operating in accordance with a uniform selection algorithm that noise shapes the response of the digital-to-analog conversion operation, the uniform selection algorithm determining the values of each of said DAC elements for the associated conversion operation, the uniform selection algorithm shaping noise due to mismatching in said DAC elements, and
said selection including a constraining device for constraining the operation of the uniform selection algorithm during operation thereof to change the values of at least two of said DAC elements from that determined by the uniform selection algorithm to result in a constrained uniform selection algorithm; and
an output for outputting the result of the conversion operation.

21. The converter of claim 20, wherein the received data is a series of data values to be converted operating in sequential conversion operations.

22. The converter of claim 21, wherein the uniform selection algorithm operates based upon at least one previous cycle.

23. The converter of claim 22, wherein the uniform selection algorithm has a second order noise shaping response such that it is based upon at least two previous conversion cycles and the noise associated therewith.

24. The converter of claim 23, wherein the second order noise shaping response associated with the uniform selection algorithm is constrained by said constraining device to constrain the results in a modified second order noise shaping response.

25. The converter of claim 24, wherein the said constraining device is operable to constrain the outputs such that any noise resulting from constraining the outputs to a defined number of states distributes the noise over substantially all of said DAC elements.

26. The converter of claim 20, wherein said converter converts digital data to analog data.

27. The converter of claim 26, and further comprising:
an interpolator for interpolating sampled digital data to a higher oversampled frequency; and
an oversampled delta-sigma modulator for processing the interpolated data prior to processing data through said multi-bit digital-to-analog converter.

28. The converter of claim 27, wherein said delta-sigma modulator comprises a multi-bit delta-sigma modulator.

29. The converter of claim 26, and further comprising a filter for filtering the output with a low pass filter to filter out out-of-band noise.

30. The converter of claim 20, wherein said constraining device is operable to constrain said DAC elements to define said states less than the number of states available to the uniform selection algorithm.

31. The converter of claim 30, wherein said constraining device is operable to constrain the output to only two states.

32. The converter of claim 31, wherein the two states are a "0" logic state in a "1" logic state.

33. The converter of claim 20, wherein each of said DAC elements is restricted to one of two states.

34. The converter of claim 33, wherein the first state corresponds to a logic "0" and the second state corresponds to a logic "1."

35. The converter of claim 20, wherein each of said DAC elements is substantially identical except for the mismatches associated therewith.

36. The converter of claim 20, wherein each of said DAC elements comprises a switched capacitor.

37. The converter of claim 20, wherein the uniform selection algorithm is a data weighted averaging algorithm.

38. A data converter for converting data, comprising the steps of:
receiving digital data to be converted in an associated conversion operation wherein the received data is a series of data values to be converted operating in sequential conversion operations;
a multi-bit digital-to-analog converter operable to process the digital data through a multi-bit digital-to-analog conversion operation, said multi-bit digital-to-analog converter including:
a plurality of digital-to-analog conversion (DAC) elements, each operable to provide one of a plurality of discrete values therefrom,
a selector for selecting the discrete values that are to be output from each of said DAC elements in accordance with the value being converted,
a summing device for summing the outputs of said DAC elements for the associated received data,
said selector operating in accordance with a uniform selection algorithm that operates based upon at least one previous cycle noise and shapes the response of the digital-to-analog conversion operation with a second order noise shaping response such that it is based upon at least two previous conversion cycles and the noise associated therewith, the uniform selection algorithm determining the values of each of said DAC elements for the associated conversion operation, the uniform selection algorithm shaping noise due to mismatching in said DAC elements, and
a constraining device for constraining the operation of the uniform selection algorithm during operation thereof to change the values of at least two of said DAC elements from that determined by the uniform selection algorithm; and an output for outputting the result of the conversion operation;
wherein the noise equation for the uniform selection algorithm is as follows:

$$n(k) = n_2(k) - 2n_1(k) + n_0(k)$$

where $n(k)$ is the error of the current conversion cycle and contains three terms $n_2(k)$, $-2n_1(k)$ and $n_0(k)$ with $n_1 k = n_2(k-1)$, $n_0(k) = n_1(k-1)$, where $n_2(k-1)$ and $n_1(k-1)$ are 1st and 2nd terms in $n(k-1)$, the error of the previous conversion cycle.

* * * * *